US012027231B2

(12) United States Patent
Brox et al.

(10) Patent No.: US 12,027,231 B2
(45) Date of Patent: Jul. 2, 2024

(54) OFFSET CANCELLATION

(71) Applicant: Micron Technology, Inc., Boise, ID (US)

(72) Inventors: Martin Brox, Munich (DE); Wolfgang Anton Spirkl, Germering (DE); Thomas Hein, Munich (DE); Michael Dieter Richter, Ottobrunn (DE); Peter Mayer, Neubiberg (DE)

( * ) Notice: Subject to any disclaimer, the term of this patent is extended or adjusted under 35 U.S.C. 154(b) by 249 days.

(21) Appl. No.: 17/669,153

(22) Filed: Feb. 10, 2022

(65) Prior Publication Data

US 2022/0172757 A1 Jun. 2, 2022

Related U.S. Application Data

(63) Continuation of application No. 16/601,439, filed on Oct. 14, 2019, now Pat. No. 11,276,443.

(Continued)

(51) Int. Cl.
*G11C 7/22* (2006.01)
*G06F 13/40* (2006.01)
(Continued)

(52) U.S. Cl.
CPC .......... *G11C 7/227* (2013.01); *G06F 13/4086* (2013.01); *G11C 5/147* (2013.01);
(Continued)

(58) Field of Classification Search
CPC ....... G11C 7/227; G11C 5/147; G11C 7/1063; G11C 7/109; G11C 7/14;
(Continued)

(56) References Cited

U.S. PATENT DOCUMENTS 6,347,287 B1 2/2002 Beckett et al.
6,356,106 B1 3/2002 Greeff et al.
(Continued)

FOREIGN PATENT DOCUMENTS

CN 101681284 A 3/2010
CN 101692634 A 4/2010
(Continued)

OTHER PUBLICATIONS

ISA/KR, International Search Report and Written Opinion of the International Searching Authority, Int'l. Appl. No. PCT/US2019/056285, dated Feb. 11, 2020, Korean Intellectual Property Office, Seo-gu, Daejeon, Republic of Korea, 12 pgs.
(Continued)

*Primary Examiner* — Jung Kim

(57) ABSTRACT

Systems, methods, and apparatuses for offset cancellation are described. A memory device may determine that a channel is in a state that interrupts an active termination of the channel and enable the calibration of a reference voltage (e.g., by the memory device). For example, a channel used for data communications with a second device (e.g., a controller) may initially be in a state of active termination. The memory device may determine that the channel has transitioned to another state that interrupts the active termination. While the channel is in the other state, the memory device may calibrate a reference voltage of a receiver by transmitting calibration signals on the channel and detecting an offset associated with a reference voltage. The memory device may use the detected offset and the reference voltage to identify signals transmitted to the memory device over the channel.

20 Claims, 7 Drawing Sheets

Related U.S. Application Data

(60) Provisional application No. 62/746,250, filed on Oct. 16, 2018.

(51) Int. Cl.
    *G11C 5/14*           (2006.01)
    *G11C 7/10*           (2006.01)
    *G11C 7/14*           (2006.01)

(52) U.S. Cl.
    CPC ............ *G11C 7/1063* (2013.01); *G11C 7/109* (2013.01); *G11C 7/14* (2013.01); *G11C 2207/2254* (2013.01)

(58) Field of Classification Search
CPC . G11C 2207/2254; G11C 29/08; G11C 29/52; G11C 29/021; G11C 29/022; G11C 29/028; G11C 7/1093; G11C 29/4401; G11C 7/1084; G11C 11/2273; G11C 11/221; G11C 11/2297; G06F 13/4086
See application file for complete search history.

(56) References Cited

U.S. PATENT DOCUMENTS

| | | |
|---|---|---|
| 7,525,338 B2 | 4/2009 | Nguyen et al. |
| 9,570,182 B1 | 2/2017 | Yanagidaira et al. |
| 2005/0141601 A1 | 6/2005 | Renaud et al. |
| 2005/0265437 A1 | 12/2005 | Yeung et al. |
| 2007/0279084 A1 | 12/2007 | Oh et al. |
| 2009/0327789 A1 | 12/2009 | Zerbe et al. |
| 2010/0192000 A1* | 7/2010 | Fox .................... G06F 13/4086 710/305 |
| 2010/0202227 A1 | 8/2010 | Nguyen et al. |
| 2010/0315119 A1 | 12/2010 | Welker et al. |
| 2011/0242916 A1 | 10/2011 | Seol et al. |
| 2011/0314200 A1 | 12/2011 | Wilson et al. |
| 2012/0051171 A1 | 3/2012 | Swanson et al. |
| 2012/0166894 A1 | 6/2012 | Jang |
| 2012/0182044 A1 | 7/2012 | Oh |
| 2013/0335135 A1 | 12/2013 | Chen |
| 2014/0186374 A1 | 7/2014 | Ramachandra |
| 2014/0266299 A1 | 9/2014 | Seol et al. |
| 2014/0286388 A1 | 9/2014 | Gondi et al. |
| 2014/0347092 A1 | 11/2014 | Amirkhany et al. |
| 2016/0259385 A1 | 9/2016 | Tang |
| 2017/0062058 A1 | 3/2017 | Yanagidaira et al. |
| 2017/0099050 A1 | 4/2017 | Lee et al. |
| 2017/0168746 A1 | 6/2017 | Kwon et al. |
| 2017/0331615 A1 | 11/2017 | Ware et al. |
| 2017/0364108 A1 | 12/2017 | Lee et al. |
| 2019/0063967 A1 | 2/2019 | Smith et al. |
| 2019/0305925 A1 | 10/2019 | Ware et al. |

FOREIGN PATENT DOCUMENTS

| | | |
|---|---|---|
| CN | 101770815 A | 7/2010 |
| CN | 103119652 A | 5/2013 |
| CN | 103547978 A | 1/2014 |
| CN | 106531204 A | 3/2017 |
| CN | 107528577 A | 12/2017 |
| KR | 10-2010-0057278 A | 5/2010 |
| WO | 2010085408 A1 | 7/2010 |

OTHER PUBLICATIONS

European Patent Office, "Supplementary European search report and search Opinion", issued in connection with European Patent Application No. 19874729.7 dated Jun. 15, 2022 (7 pages).

Chinese patent office, "China Office Action," issued in connection with China Patent Application No. 201980074401.2 dated Dec. 1, 2023 (17 pages) (6 pages of English Translation and 11 pages of Original Document).

* cited by examiner

OFFSET CANCELLATION

CROSS REFERENCE

The present Application for Patent is a continuation of U.S. patent application Ser. No. 16/601,439, now U.S. Pat. No. 11,276,443, by Brox et al., entitled "OFFSET CANCELLATION," filed Oct. 14, 2019, which claims priority to U.S. Provisional Patent Application No. 62/746,250 by Brox et al., entitled "OFFSET CANCELLATION," filed Oct. 16, 2018, each of which is assigned to the assignee hereof and each of which is expressly incorporated by reference in its entirety.

BACKGROUND

The following relates generally to a system that includes at least one memory device and more specifically to offset cancellation.

Memory devices are widely used to store information in various electronic devices such as computers, wireless communication devices, cameras, digital displays, and the like. Information is stored by programing different states of a memory device. For example, binary devices may store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Memory devices may include various channels for communicating information with other devices (e.g., a controller) within a system. Procedures used to configure receivers of a memory device to ensure that data is effectively and efficiently received from other devices are desired.

DETAILED DESCRIPTION

Figure 1:
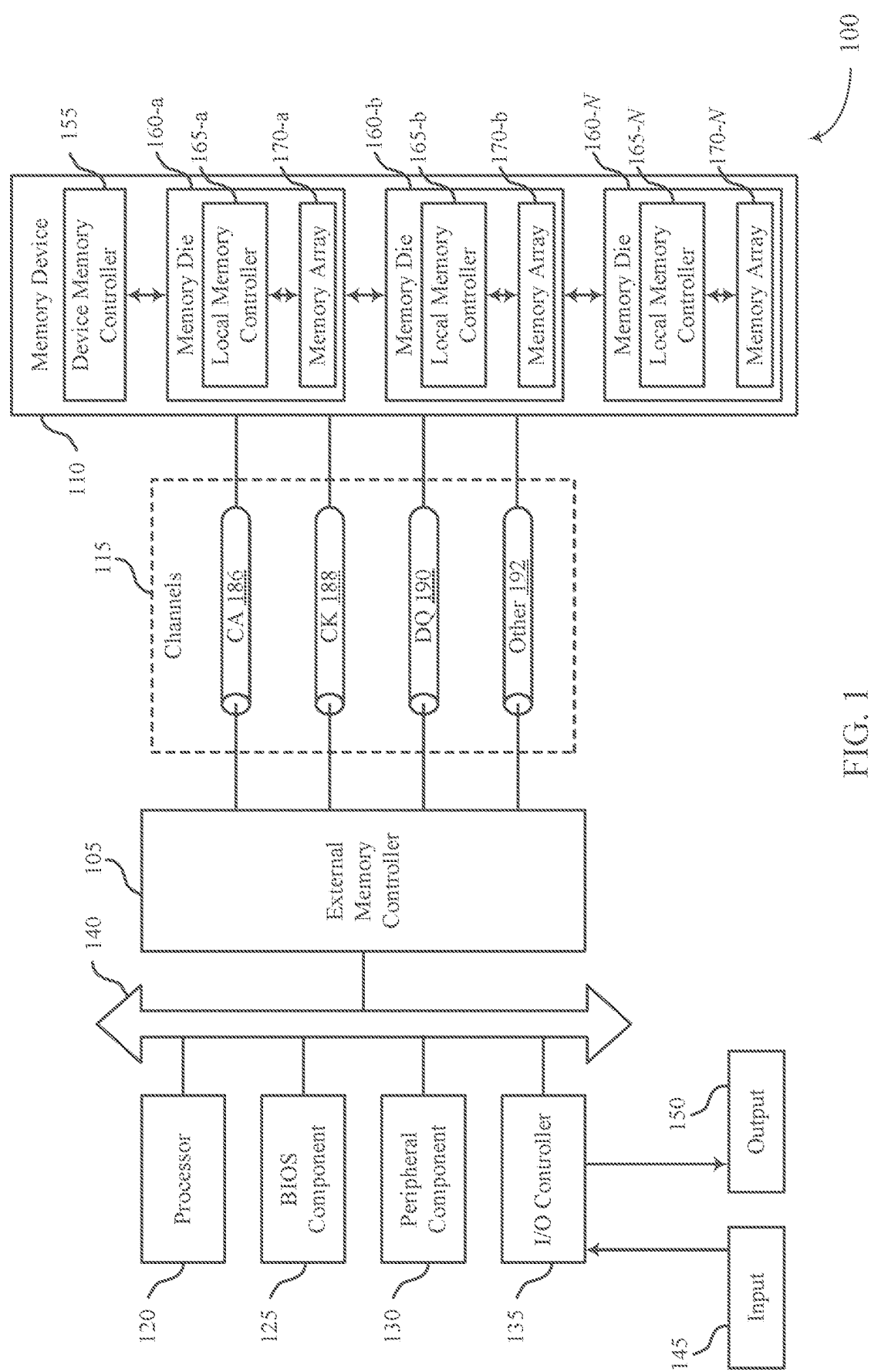
FIG. 1 illustrates an example of a system that supports offset cancellation as described herein.

In some memory systems, procedures may be used to tune receivers that communicate data between two devices, such as a host device and a memory device. For example, calibration procedures for the receivers may reduce errors that may occur during one or more access operations (e.g., read and write operations). In some cases, the ability of receivers to efficiently detect an input signal may be affected by the type of signaling transmitted on the channel. For example, a data eye for a signal modulated according to a scheme that includes three or more levels (e.g., multi-level signaling, signaling having at least four voltage levels) may become relatively small due to intermediate voltage levels between a lowest and highest voltage.

In such cases, the voltage resolution that a receiver uses for distinguishing between levels of these signals (e.g., between a '01' and a '00') may need to be greater than the resolution for signals having, for example, two levels. Further, inherent characteristics of a receiver may also cause random variation in a local voltage experienced at the receiver (e.g., caused by variation of input transistors). Such unpredictable variation may result in an input offset that affects the ability of the receiver to accurately detect a value of a signal. As such, the calibration procedures may be used to cancel such an offset caused by the receiver circuitry.

Some memory systems may utilize terminated lines to reduce interference from signals transmitted on a channel. For instance, a channel ma include components that match the characteristic impedance of a conductive line corresponding to the channel, which may prevent signals from reflecting back toward a transmitting device and causing interference. In some cases, when not being utilized for access operations between the memory device and host device, the channel may be continually maintained at the voltage level of the termination and actively driven, for example, at low-level ('0') or high-level ('1').

However, a non-terminated (e.g., a tri-state) condition of the channel may be needed by a device (such as a memory device) to perform procedures to calibrate a receiver to compensate for input offset. To enable such procedures, a time period may be inserted into a communications protocol during which a channel is not actively terminated. As described herein, an additional state of the channel may be utilized that allows operations to be performed by a memory device while the channel is not actively terminated. In this state, the host device, as one example, may ti-state its transmitter (e.g., refrain from driving signals that result in active termination of the channel) such that the memory device may obtain full control of the channel for a period of time. While the channel is in this state, the memory device may perform one or more desired operations.

The channel may enter into a non-terminated state by various means. For example, a command may trigger a transition from a first state (e.g., where termination is active) to a second state (e.g., where termination is not active). In such cases, a device (such as the host device) may determine to transition the channel to the second state and transmit a signal to the memory device that may indicate the transition. Once the second state is identified (e.g., by the memory device), the device may have the ability to drive certain voltage levels on the channel to perform calibration procedures, such as an offset calibration procedure to cancel an offset that may be inherent to one or more receivers. In some cases, the command may be issued before an access operation, such as a high-speed access operation, is executed. For example, the command may be issued in advance of the access operation such that a calibration procedure may be performed on the channel prior to the start of the access operation.

Additionally or alternatively, the second state of the channel may be entered (e.g., automatically entered) at a particular time. For example, the second state of the channel may be entered during a power-up sequence (e.g., after the memory device exits a reset state) or at a particular time (e.g., defined time) after a power-up sequence. After a defined quantity of clock cycles (e.g., long enough to allow for calibration of the receivers), the channel may enter the second state (e.g., automatically enter the second state). In some cases, the second state also may be exited, for example, automatically (e.g., after a determined quantity of clock cycles). In other examples, a signal from the controller to the memory device may indicate the transition of the channel from the second state.

Figure 2:
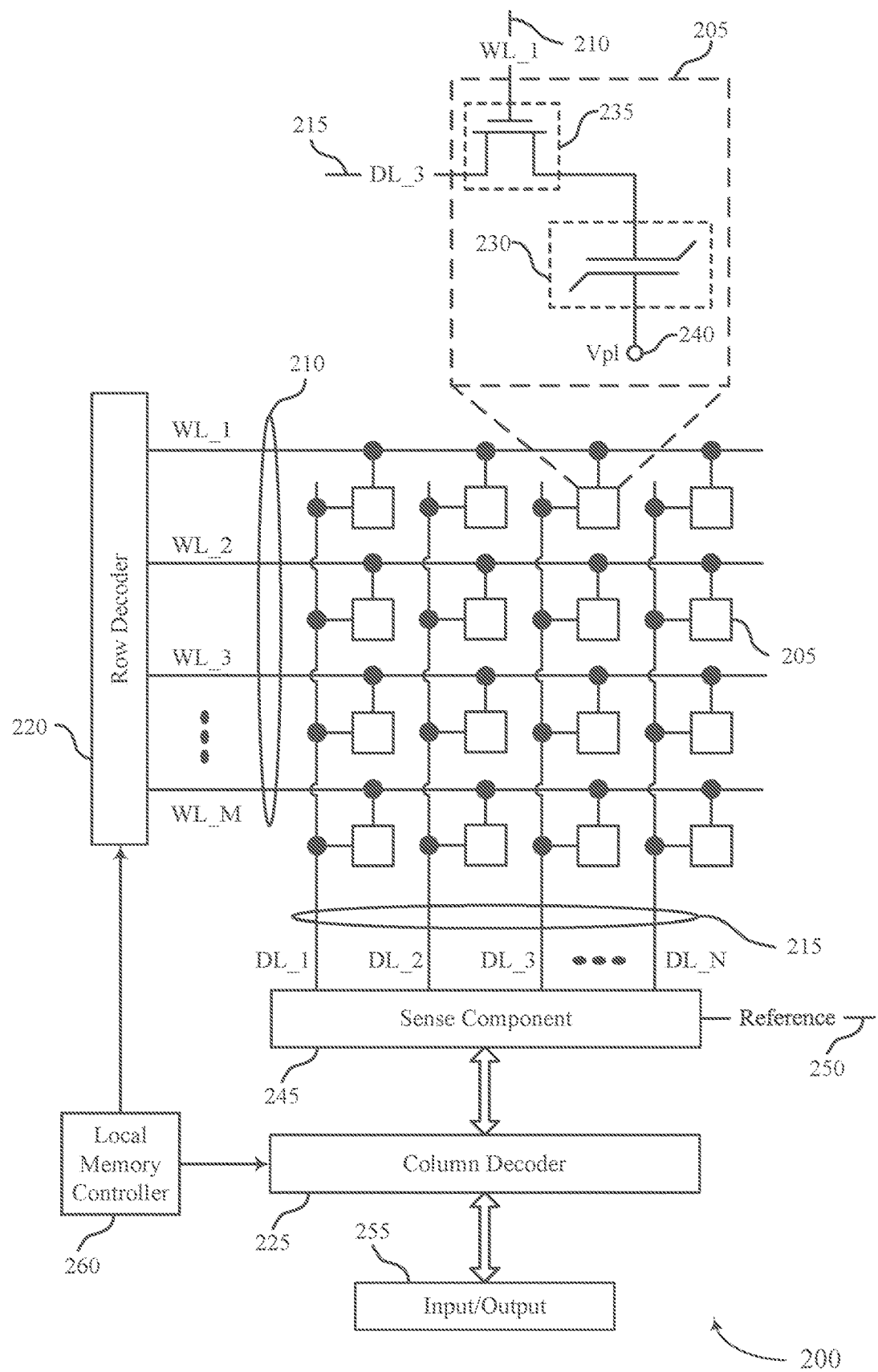
FIG. 2 illustrates an example of a memory die that supports offset cancellation as described herein.
Figure 4:
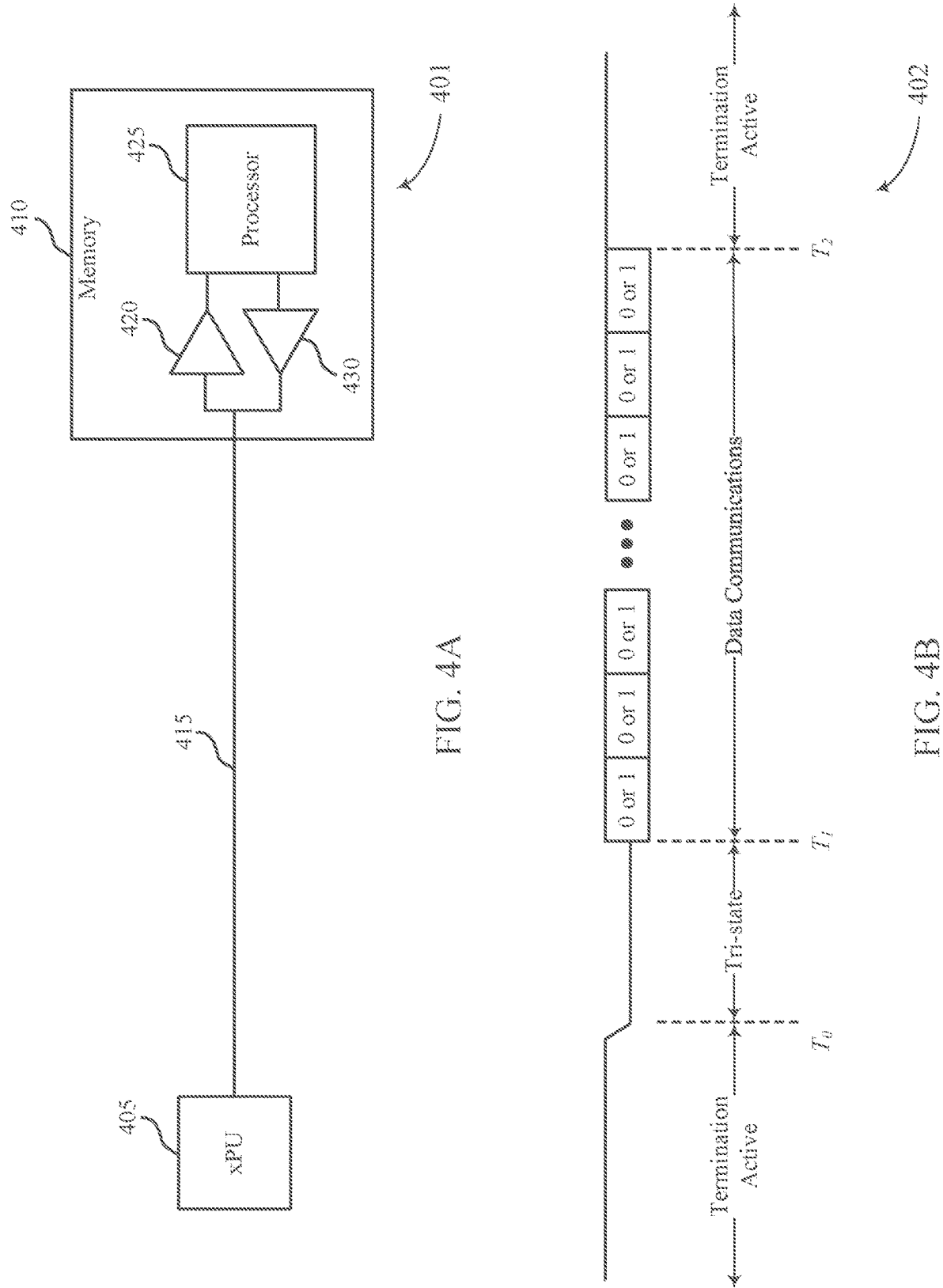
FIG. 4A illustrates an example of a system that supports offset cancellation as described herein.
FIG. 4B illustrates an example of state transitions that support offset cancellation as described herein.

Features of the disclosure are described herein at an exemplary memory system level in the context of FIG. 1 and are further described with regard to an exemplary memory device in the context of FIG. 2. Specific examples of systems and state transitions of a channel are then described in the context of FIGS. 4A and 4B. These and other features of the disclosure are further illustrated by and described with reference to a process flow of FIG. 5 and flowcharts of FIGS. 6 and 7 that relate to offset cancellation to achieve enhanced communications efficiency in memory systems.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device; 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice 160 may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller. Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or an quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array 170, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device; 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, the reference voltages of the receivers may be tuned to improve the communication across conductive lines. For example, receivers may be calibrated to account for (e.g., cancel) an offset from a reference voltage, where the offset may be caused by variation in the components of the system 100 (e.g., Monte Carlo variation of transistors). In such cases, by accounting for the offset, the receivers may be tuned to more efficiently detect signals received at a memory device.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

In some cases, the channels 115 may comprise a conductive line that is electrically terminated. For instance, a device (e.g., the memory device 110, the external memory controller 105) coupled with a channel 115 may include components that match the characteristic impedance of a conductive line corresponding to the channel. As an example, a component (e.g., at the end of a conductive line) may include a set of resistors (e.g., terminating resistors) to match the impedance of the line to prevent signals from reflecting back toward a transmitting device and causing interference. In some cases, a voltage of the component may be held at a constant value to achieve an active electrical termination of the conductive line In some cases, the external memory controller 105 may control the active termination of one or more channels 115 within the system 100. As described herein, the external memory controller 105 may refrain from driving a channel 115 such that the active termination is interrupted, thereby enabling a device (such as the memory device 110) to control the channel 115 while the channel 115 not terminated (e.g., tri-stated).

Channels 115 (and associated signal paths and terminals) may be dedicated to communicating specific types of information In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths. In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal)

and the signal paths of the WCK channels may be configured accordingly A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

System 100 may support techniques for enabling refinement of reference voltages used by receivers of a memory device 110. For instance, a channel 115 may be actively terminated and a state may be used that interrupts the active termination, thereby allowing a memory device 110 to control the channel. In such cases, the memory device 110 may actively drive calibration signals (e.g., signals that sweep through a set of reference voltages) that are used to identify an offset associated with each reference voltage at the receiver. By doing so, the memory device may compensate for (e.g., cancel) detected offsets for the receiver, which may enhance the detection of signals received by the memory device 110.

In some cases, the state of the channel (e.g., a state that removes the influence of the external memory controller 105 from the channel) may be enabled (e.g., automatically, through one or more commands such as those sent by the external memory controller 105). For instance, the channel may be tri-stated at a defined time after the memory device 110 exits a reset state (e.g., during power-up). Additionally or alternatively, the external memory controller may identify an access operation, and may signal that the channel is to be transitioned to the tri-state before the access operation. The memory device 110 may thus perform an offset calibration while the channel is tri-stated and before the access operation. In any case, the channel may transition out of the tri-state automatically or based on one more commands (e.g., from the external memory controller 105).

The use of a state that interrupts an active termination of the channel may enable a duration when the channel is not being actively driven (e.g., either for termination or for access operations), during which the memory device 110 may transmit signals on the channel. Such signals may enable the calibration of receivers to account for an offset associated with a reference voltage level and improve the resolution that a receiver has for detecting signal received at the memory device (e.g., during a write operation). Such techniques may improve communications efficiency in the system 100 by reducing the quantity of errors in received data.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor 230. In DRAM architectures, a memory cell (e.g., memory cell 205) may include a capacitor 230 that includes a dielectric material to store a charge representative of the programmable state In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit lime 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell 205. In some architectures, the word line 210 may be in electronic communication with a node of the capacitor 230 of the memory cell 205 and the memory cell 205 may not include a switching component 235.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 2270 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200. In some cases, the local memory controller 260 may control calibration of one or more components of the memory die 200. For instance, the local memory controller 260 may trigger the transmission of signals that are used for the calibration of a set of receivers. In such cases, the signals may be transmitted during a time period when a data channel is not being actively driven (e.g., by an external memory controller).

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor 230 of the target memory cell 205. The local memory controller 260 may perform a re-write operation or a refresh operation to return the memory cell 205 to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells 205 in electronic communication with that access line. Thus, a re-write operation or refresh operation may be performed on one or more memory cells 205 that may not have been accessed.

Figure 3:
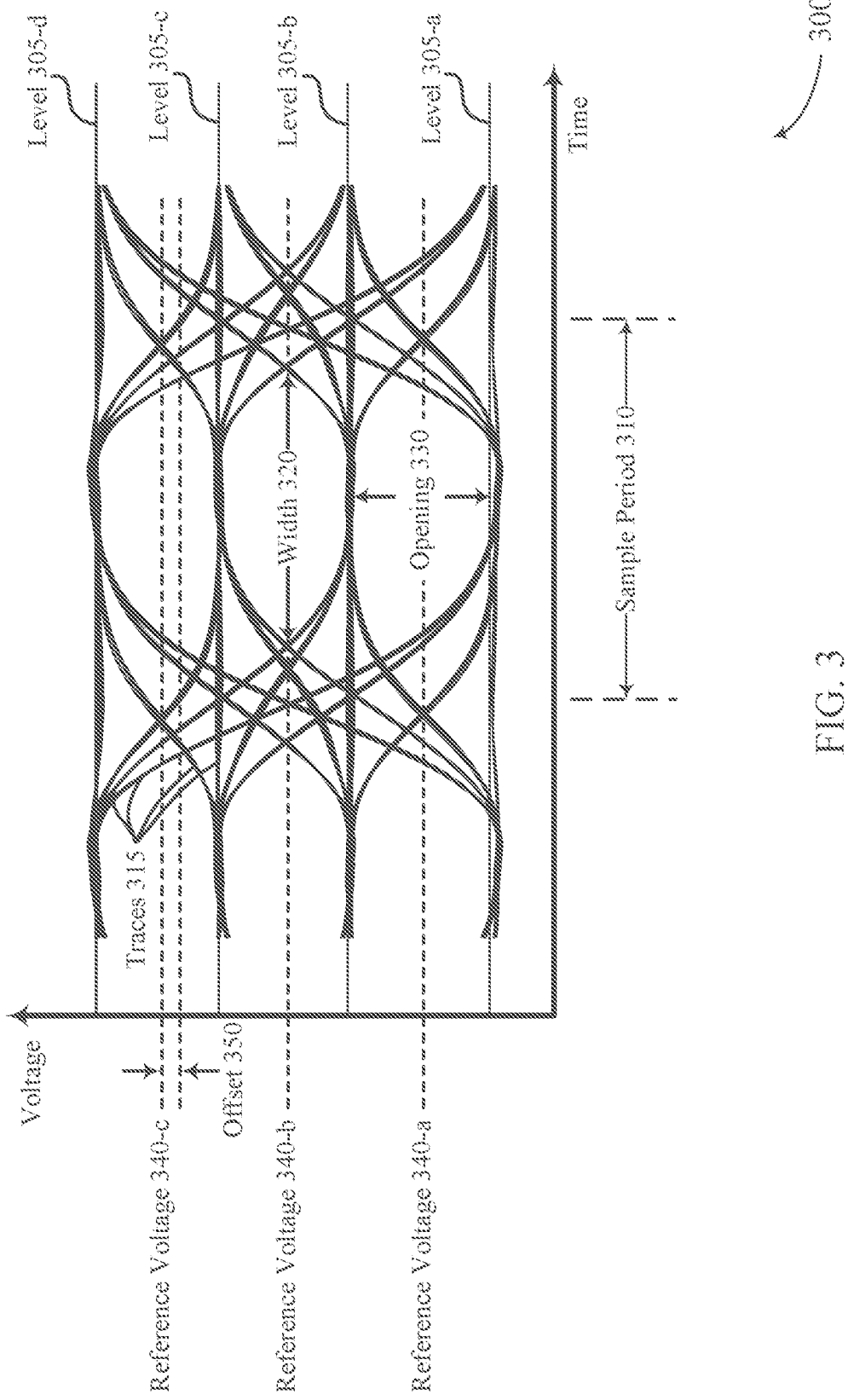
FIG. 3 illustrates an example of an eye diagram that supports offset cancellation as described herein.

FIG. 3 illustrates an example of an eye diagram 300 that supports offset cancellation as described herein. The eye diagram 300 may depict overlaid data transmissions and may illustrate implementation of aspects of system 100 and memory die 200 described with reference to FIGS. 1 and 2. In some examples, the eye diagram 300 may represent a signal modulated according to a scheme that includes three or more levels 305 (e.g., a multi-level signal).

The eye diagram 300 may be used to indicate the quality of signals in high-speed transmissions and may represent four symbols of a signal (e.g., '00', '01', '10', and '11'). In some examples, each of the four symbols may be represented by a different voltage amplitude (e.g., voltage levels 305-a, 305-b, 305-c, and 305-d). In other examples, the eye diagram 300 may represent a PAM signal (e.g., a PAM4 signal) that may be used to communicate data in a memory device (such as a memory device 110 as described with reference to FIG. 1). The eye diagram 300 may be used to provide a visual indication of the health and integrity of a signal and may further indicate noise margins of the data signal. The noise margin may, for example, refer to an amount by which the signal exceeds the ideal boundaries of the levels 305. In the present example, the eye diagram 300 illustrates four distinct voltage levels 305 (e.g., first voltage level 305-a, second voltage level 305-b, third voltage level 305-c, and fourth voltage level 305-d) or symbols that may be communicated (e.g., across a conductor), for example, using PAM4 signaling.

To generate the eye diagram 300, an oscilloscope or other computing device may sample a digital signal according to a sample period 310 (e.g., a unit interval or a bit period). The sample period 310 may be defined by a clock associated with the transmission of the measured signal In some examples, the oscilloscope or other computing device may measure the voltage level of the signal during the sample period 310 to form a trace 315. Noise and other factors may result in the traces 315 measured from the signal deviating from a set of ideal step functions. By overlaying multiple traces 315, various characteristics about the measured signal may be determined. For example, the eye diagram 300 may be used to identify different characteristics of a communication signals such as jitter, cross talk, distortion, electromagnetic interference (EMI), signal loss, signal-to-noise ratio (SNR), other characteristics, or combinations thereof. A closed eye may indicate a noisy and/or unpredictable signal.

An 'eye' of the eye diagram 300 may refer to the space between the traces 315 and may include a width, such as width 320, and an opening, such as opening 330. As the signals converge toward one of the multiple voltage levels 305-a through 305-d, the areas between the levels 305-a through 305-d that are devoid of traces 315 may thus be referred to as eyes of the eye diagram 300. Each eye in an eye diagram 300 may have a unique width 320 based on the characteristics of the measured signal. Various encoding and decoding techniques may be used to modify the width 320 of the measured signal.

To distinguish between different voltage levels 305 when decoding a signal, respective reference voltages 340 may be located between the different levels 305 represented by the traces 315. For example, a low-level reference voltage 340-a may be positioned between the first voltage level 305-a and the second voltage level 305-b; a mid-level reference voltage 340-b may be positioned between the second voltage level 305-b and the third voltage level 305-c; and a high-level reference voltage 340-c may be positioned between the third voltage level 305-c and fourth voltage level 305-d. When decoding, the signals represented by the traces 315 may be compared to the reference voltages 340 at a sampling time that may occur near the middle of the sample period 310. The smaller the eye associated with each reference voltage 340, the more likely that errors may be introduced into the detection. As such, the receiver may ideally use a minimum voltage difference (with respect to a reference voltage 340) to distinguish whether a particular signal is higher or lower than the reference voltage 340. But in reality, the data eye may be smaller, for example, due to cross coupling, noise, unstable voltages, and the like. An error (e.g., an incorrect value) may thus be detected if a signal meant to convey the first voltage level 305-a settles above the low-level reference voltage 340-a or inadvertently crosses above the low-level reference voltage 340-a when a sampling time occurs. As a result, the receiver may determine that the second voltage level 305-b was signaled, when in fact the first voltage level 305-a was signaled.

For high-speed data transmissions (e.g., transmissions having a data transfer rate that satisfies a threshold), it may become increasingly difficult for the receiver to distinguish whether a signal is below or above a respective reference voltage 340. Further, some receivers may be subject to a variable offset 350 when sensing received signals. The offset 350 may be caused by certain inherent characteristics of the receiver itself (e.g., due to the manufacturing process, which may result in local voltage variation from random dopant placement). For instance, a receiver's circuitry may comprise a complimentary metal-oxide-semiconductor (CMOS) transistor that compares a received signal to a reference voltage 340 (e.g., similar to a differential amplifier). Although CMOS transistors may be manufactured to be identical, the inherent characteristics and behavior of individual CMOS transistors may vary (an effect that may be referred to as Monte-Carlo variation). As such, a receiver may experience variation in the sensed voltage level of received signals, which may be based on the area of the CMOS transistor. This variation may result in the offset 350 from a reference voltage 340 that affects the receiver's ability to correctly determine whether a signal is above or below a reference voltage 340. These receiver characteristics that result in voltage variation, in addition to small data eyes, may make it difficult to effectively receive data in high-speed transmission scenarios without errors.

As disclosed herein, however, a state of a channel may be enabled to perform a calibration procedure to compensate for the offset 350 caused by the inherent variation produced by receiver circuitry. For example, the state may be enabled on the channel (e.g., a channel that is normally actively terminated) for a period of time that provides a device, such as a receiving device, with an opportunity to drive calibration signals on the channel. These calibration signals may enable the device to detect an offset 350 associated with a reference voltage 340 and compensate for (e.g., cancel) the offset 350 (e.g., by modifying the associated reference voltage 340, or modifying some other characteristic of the receiver circuitry). As a result, the offset 350 may be compensated for to improve the resolution and reliability of detecting the value of received signals. In cases where the offset 350 is not time or temperature dependent, the offset cancellation may be performed a single time before an access operation (e.g., a read operation or a write operation) to ensure accurate identification of received data.

FIGS. 4A and 4B illustrate an example or examples of a system 401 and state transitions 402 of a channel, respectively, that supports offset cancellation as described herein. The system 401 may include a controller 405 and a memory device 410, each of which may implement aspects of the described techniques. The disclosure herein is not limited to examples that include a controller, or a memory device, or both. The operations and aspects described herein are not limited to use of these components, and other alternatives are contemplated.

Controller 405 may be an example of an external memory controller 105 (e.g., a CPU, GPU, GPGPU, or the like) as described herein with reference to FIG. 1. Additionally or alternatively, the memory device 410 may be an example of a memory device 110 (e.g., a graphics double data rate (GDDR) memory device) as described with reference to FIGS. 1 through 3.

The memory device 410 may communicate with the controller 405 over one or more channels 415. Such channels 415 (e.g., conductive lines) may couple a pin of the memory device 410 with a pin of the other device. For example, a channel 415 may couple a data (DQ) pin of the memory device 410 with a corresponding pin of the controller 405, and data may be communicated between the memory device 410 and the controller 405. The controller 405 may perform access operations with the memory device 410, where data is transmitted to the memory device 410 during a write operation, and the memory device 410 may accordingly receive the data using one or more receivers 420.

Receivers, such as the receiver 420, may be affected by the type of signaling transmitted on the channel 415. For example, a data eye for multi-level signaling may become relatively small due to the intermediate amplitudes between a lowest and highest amplitude (e.g., between first voltage level 305-a and fourth voltage level 305-d, as described with reference to FIG. 3). As a result, the voltage resolution that a receiver 420 uses for distinguishing between multi-level signals (e.g., between a '01' and a '00') may need to be greater than the resolution for signals having two levels. Further, characteristics of the receiver 420 may cause random variation in a local voltage experienced at the receiver 420 (e.g., caused by Monte Carlo variation of input transistors), resulting in an input offset that affects the ability of the receiver 420 to accurately detect a value of a signal.

The system 401 may implement terminated lines to reduce interference from signals transmitted on channel 415. In such examples, the channel 415 may include components that match the characteristic impedance of a conductive line corresponding to the channel 415, which may prevent signals from reflecting back towards a transmitting device and causing interference. The channel 415 may be maintained at the voltage level of the termination and actively driven, for example, at low-level ('0') or high-level ('1').

A non-terminated (e.g., a tri-state) condition of the channel 415, however, may be needed if the memory device 410 is to perform procedures to calibrate a receiver 420 to compensate for the input offset described above. Specifically, in other systems, a memory device 410 may not have control of the channel 415 as the memory device 410 may merely react to instructions received from the controller 405 for access operations. When not performing an access operation, the controller 405 may drive the channel 415 in the active termination state, and the channel 415 may not be available to the memory device 410 at any time. For example, an offset calibration procedure may include driving, by the memory device 410, a voltage associated with a receiver reference voltage (e.g., a voltage corresponding to one of the reference voltages 340 as described with reference to FIG. 3) to identify any receiver offset. But, in other terminated systems, offset calibration may not be possible if the memory device 410 does not have an opportunity to control the channel 415 and drive such signals.

To enable such operations, a time period during which the channel 415 is not actively terminated may be inserted into a communications protocol. As described herein, an additional state of the channel 415 may be introduced to allow for operations to be performed by the memory device 410. In this state, the controller 405 may tri-state its transmitter (e.g., refrain from driving signals that result in active termination of the channel 415) such that the memory device 410 may obtain full control of the channel 415. While the channel 415 is in this state, the memory device 410 may perform its desired operations when independent control of the channel 415 is needed. As an example, an offset calibration for the receiver 420 may be performed. In such cases, a processor 425 of the memory device 410 may identify that the channel has entered a state where termination is no longer active, and voltages in the range of a reference voltage of the receiver 420 may be driven onto the channel 415 by a driver 430. The voltages driven on the channel 415 by the memory device 410 may not be modified by a termination on the controller side, enabling the processor 425 to sweep through a set of voltages to identify any input offset from the receiver 420.

As illustrated in the state transitions 402 of FIG. 4B, the channel 415 may transition between different states that respectively correspond to enabling active termination, no termination (e.g., a tri-state), and data communications. For instance, the channel 415 may initially be in a first state where termination is active and, at time $T_0$, the channel may transition to a second state corresponding to a tri-state. While tri-stated, the memory device 410 may perform operations using the channel 415, which may include transmitting signals on the channel 415. After a period of time, the channel 415 may transition, at time $T_1$, out of the second state to perform an access operation, where data may be communicated between the controller 405 and the memory device 410 on the channel 415. Following the conclusion of the access operation at time $T_3$, the channel 415 may transition back to the first state with termination active. It is noted that the state transitions 402 is just one illustrative example of the different states that the channel 415 may take, and additional or different states may be used. For instance, at time $T_1$, the channel 415 may transition from the second state back to the first state (with termination active). Additionally, while the state transitions 402 show the active termination at a high-level, it is understood that the channel 415 may also be actively terminated at a low-level, as described herein.

The channel 415 may enter into a non-terminated state by various means. For example, a command may trigger a transition from the first state (e.g., where termination is active) to the second state (e.g., where termination is not active). In such cases, a device (such as the controller 405) may determine to transition the channel 415 to the second state, and transmit a signal to the memory device 410 that may indicate the transition. The processor 425 may identify that the state of the channel 415 is to transition (and may further identify a period of time that the channel 415 will be tri-stated), and may cause the driver 430 to drive signals on the channel 415 while in the second state. That is, once the second state is identified by the memory device 410, the memory device 410 may have the ability to drive certain voltage levels on the channel 415 to perform calibration procedures, such as an offset calibration to cancel an offset that may be inherent to one or more receivers 420. In some cases, the channel 415 may transition (e.g., automatically transition) out of the second state after a period of time or a signal may be sent to indicate that the channel 415 is transitioning from the second state. The signaling that indicates the state transitions of channel 415 may be transmitted, to the memory device 410 on the channel 415 itself or using a different channel.

In some cases, the command may be issued before an access operation, such as a high-speed access operation. That is, the system 401 may initially start up in a first mode, such as a low-speed mode (e.g., with one or more access operations having a data transfer rate below a threshold), and offset calibration may not be needed in such a mode. For example, under normal operation, the controller 405 may be configured to perform limited operations. But when entering a second mode, such as a high-speed mode (e.g., for a 3D game, complex graphical visualization or manipulation), then the system 401 and the memory device 410 may enter into a different mode. In such cases, a command to transition the channel 415 to the tri-state may be issued before entering into the high-speed mode. Accordingly, the receiver(s) 420 of the memory device 410 may be sufficiently calibrated to enable efficient data communication during the ensuing access operations.

Additionally or alternatively, the second state may be automatically entered at a particular time. For example, the tri-state of the channel 415 may be entered during a power-up sequence (e.g., after the memory device exits a reset state) or at a defined time after a power-up sequence. After a defined quantity of clock cycles (e.g., corresponding to time $T_0$) the channel 415 may enter the second state automatically. As an illustrative example, clock cycles may be counted following the exit from the reset state, and from 2000 clock cycles after reset exit to 3000 clock cycles after reset exit, the memory device 410 may have control over the channel 415. Different values of clock cycles may be possible, and those given are for ease of description only. The processor 425 may be aware of the quantity of clock cycles, and cause the driver 430 to perform an offset calibration on the channel 415 (e.g., after time $T_0$).

In some cases, the second state may be exited automatically (e.g., after a determined quantity of clock cycles). In other examples, the controller 405 may transmit a signal or command that indicates the transition of the channel 415 from the second state. By entering (and/or exiting) the tri-state of channel 415 automatically, a command entry and associated overhead may be avoided within the system 401. Additionally, the tri-state of channel 415 may be entered automatically before performing an access operation, and an offset calibration performed while the channel 415 is in the second state may enable efficient data communication for as long as the memory device 410 is powered up (e.g., multiple offset calibrations may not be needed, such as when the offset is not dependent on time and/or temperature).

Figure 5:
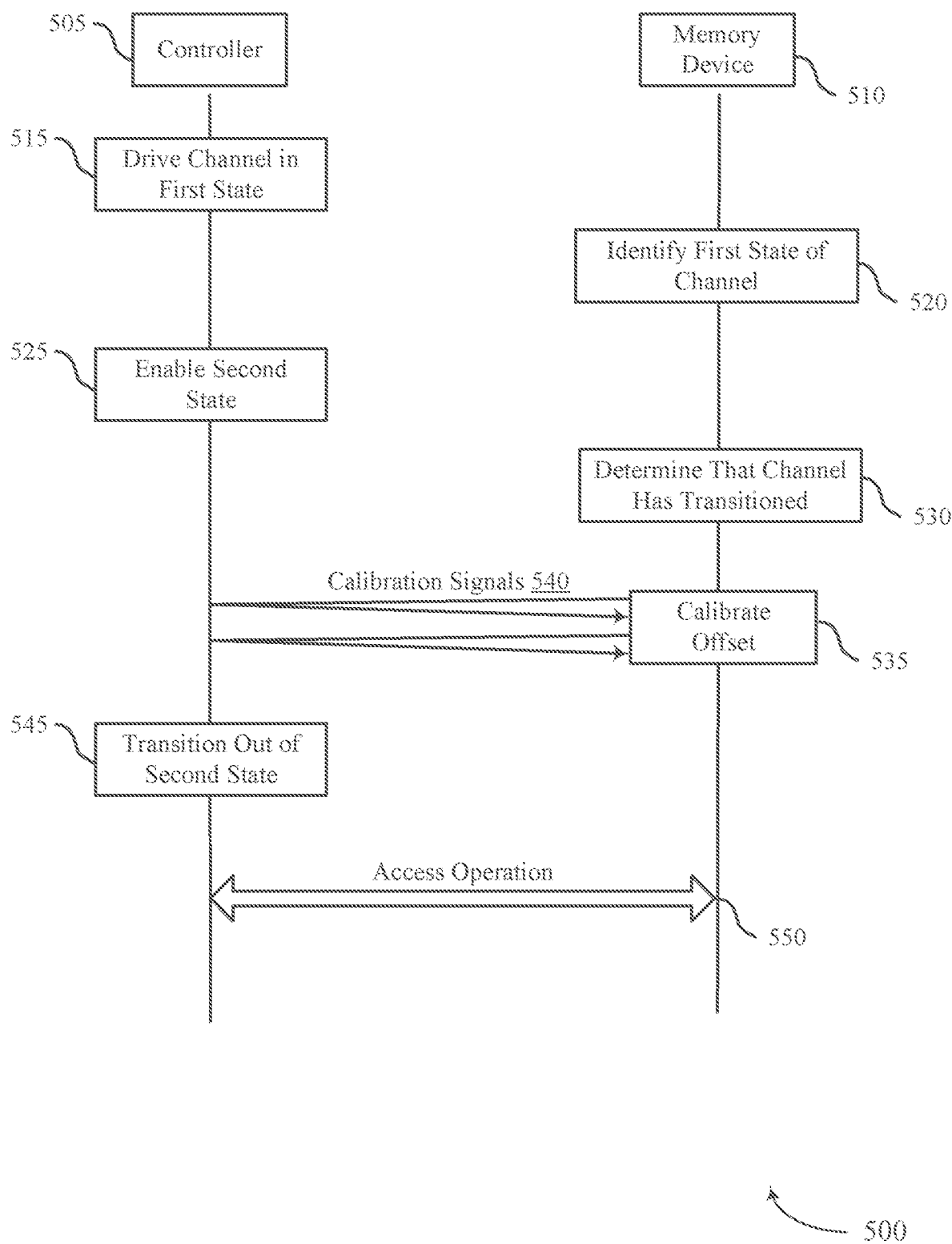
FIG. 5 illustrates an example of a process flow in a system that supports offset cancellation as described herein.

FIG. 5 illustrates an example of a process flow 500 in a system that supports offset cancellation as described herein. In some examples, aspects of process flow 500 may be implemented by a controller 505 and a memory device 510, which may be examples of the corresponding devices described with reference to FIGS. 1-3, 4A and 4B. The disclosure herein is not limited to examples that include a controller, or a memory device, or both. The operations and aspects described herein are not limited to use of these components, and other alternatives are contemplated.

For instance, the controller 505 may be an example of an external memory controller 105 (e.g., a GPU) described with reference to FIG. 1. Additionally, the memory device 510 may be an example of a memory device 110 described with reference to FIG. 1. Process flow 500 may illustrate the use of a different state of a channel to interrupt an active termination state, thereby enabling the memory device 510 to perform an offset calibration. Such techniques may improve the reliability of the receivers of the memory device 510 and improve communications efficiency (e.g., where fewer errors may occur when identifying a received signal).

At 515, the controller 505 may drive a channel for communicating data in a first state that results in an active termination of the channel. For example, the channel may be driven at a low-level ('0') or at a high-level ('1') to achieve the active termination. At 520, the memory device 510 may identify that the channel is in the first state and actively terminated.

At 525, the controller 505 may enable a second state that interrupts the active termination, which may enable the memory device 510 to perform an offset calibration on the channel. In such cases, the controller 505 may refrain from driving the channel. In some cases, the controller 505 may cause its transmitters to enter into a tri-state, which may remove the influence of the controller 505 on the channel. In some cases, the controller 505 may identify a first time period, a second time period, or both, after the memory device 510 exits a reset state and may enable the second state by refraining from driving the channel between the first time period and the second time period. Or the controller may otherwise manage or drive the channel during either or both of the first or second time periods. The first and second time periods may be determined or preconfigured, and the channel may transition (e.g., automatically transition) to the second state based on these determined time periods. In other examples, the controller 505 may identify a command to execute an access operation over the channel. The controller 505 may then transmit a signal, before the access operation begins, to indicate that the channel is transitioning to the second state.

At 530, the memory device 510 may determine that the channel transitioned from the first state to the second state and may thus identify that the active termination was interrupted. As such, at 535, the memory device 510 may calibrate an offset associated with a reference voltage for identifying signals received on the channel for a receiver coupled with the channel and while the channel is in the second state. In such cases, the offset calibration may include the transmission of various calibration signals on the channel.

As an illustrative example, once the controller 505 turns off its drivers to enter the channel into the tri-state, the memory device may determine that it has control over the channel. In performing the offset calibration on a non-terminated channel, the memory device 510 may drive voltages on the channel that will not be modified by a termination on the controller side. For instance, the memory device 510 may determine the reference voltage levels, then a driver of the memory device 510 may drive the determine reference voltage levels on the channel. The memory device 510 may sweep through various un-modified voltages (e.g., because the termination was interrupted), and the receiver of the memory device 510 may detect detects these voltages. Accordingly, the memory device 510 may identify the voltage level where there is a transition from 0 to 1. That is, the memory device 510 may identify where the receiver is transitioning from one level to another. These levels may ideally be at the determined reference voltage level, but there may be some offset based on the characteristics of the receiver.

In cases where an offset for a receiver is identified, the receiver may be modified based on the offset. For example, the memory device may modify the level at which the signals are received (e.g., where a transition from 0 to 1 may be identified), or some other characteristic of the receiver. For instance, the receiver may perform similar to a differential amplifier, where a reference voltage and an input on the channel are compared. By turning on additional transistors, a programmable imbalance may be created, which may counteract any identified offset.

At 545, after the completion of the offset calibration, the controller 505 may transition the channel out of the second state. In some cases, the transition out of the second state may be automatic. Additionally or alternatively, the transition may be based on a command from the controller 505. In some cases, the channel may be transitioned back to the first state associated with the active termination of the channel. At 550, the controller 505 and the memory device 510 may perform an access operation over the channel, based on transitioning the channel out of the second state.

Figure 6:
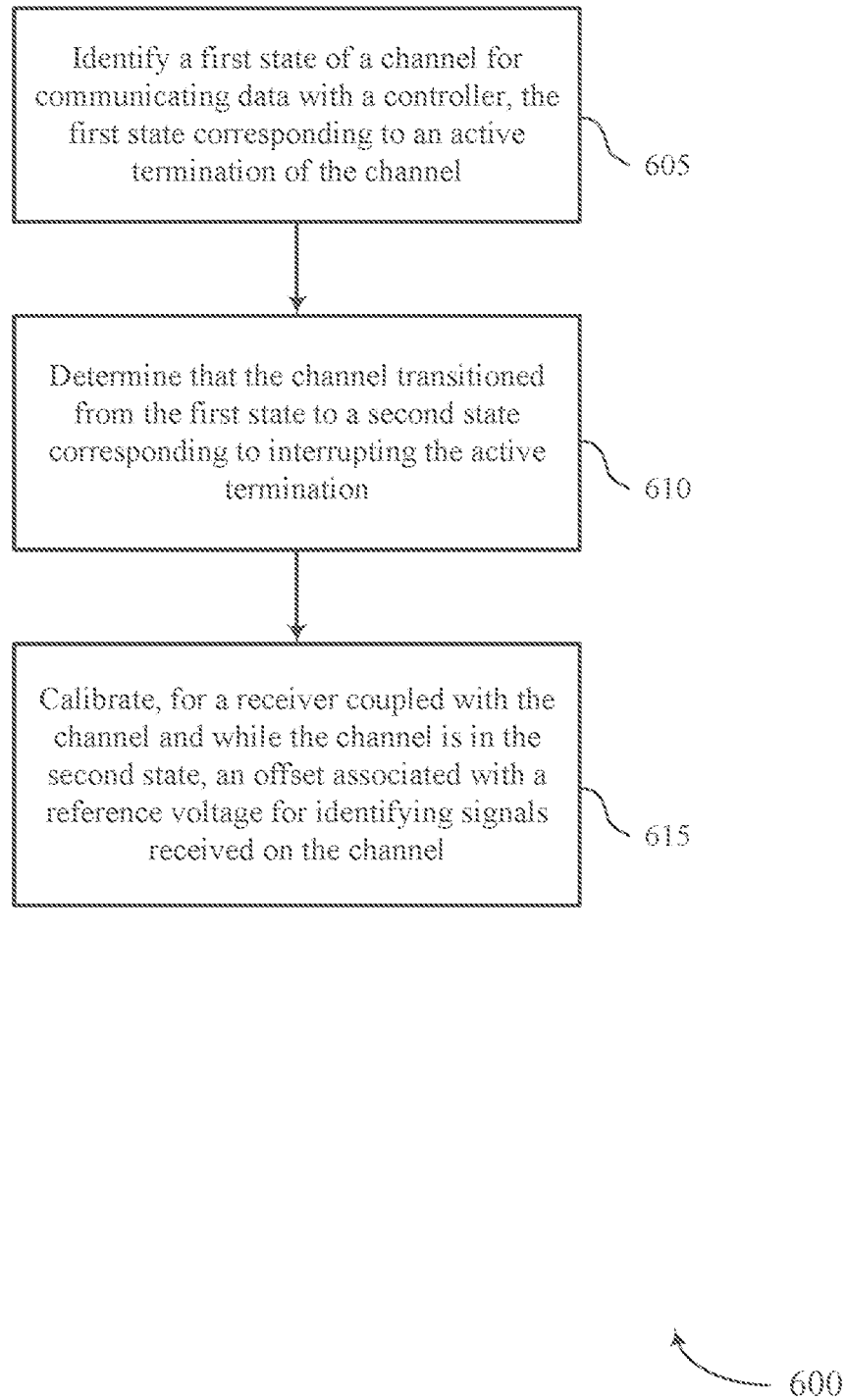
FIGS. 6 and 7 show flowcharts illustrating a method or methods that support offset cancellation as described herein.

FIG. 6 shows a flowchart illustrating a method 600 that supports transmission failure feedback schemes for reducing crosstalk in accordance with aspects disclosed herein. The operations of method 600 may be implemented by a memory device or its components, as described with reference to FIGS. 1-5. For example, the operations of method 600 may be performed by a memory device 410 as described with reference to FIG. 4 or a memory device 510 as described with reference to FIG. 5. In some examples, the memory device may execute a set of instructions or codes to control the functional elements of the memory device to perform the functions described herein.

At 605 the memory device may identify a first state of a channel for communicating data with a controller. The first state may correspond to an active termination of the channel. That is, the channel may be actively terminated to prevent transmitted signals from reflecting off the receiving end of a conductive line. The operations of 605 may be performed according to the methods described with reference to FIGS. 1-5.

At 610 the memory device may determine that the channel has transitioned from the first state to a second state corresponding to interrupting the active termination. For instance, the second state may be a tri-state of the channel (e.g., in accordance with a tri-state logic). In cases where the channel is no longer actively driven by the controller, the memory device may transmit signals while the channel is tri-stated. In some cases, the transition of the channel from the first state to the second state may be based on a determined time period (e.g., after exiting a restart state). The operations of 610 may be performed according to the methods described with reference to FIGS. 1-5.

At 615 the memory device may calibrate, for a receiver coupled with the channel and while the channel is in the second state, an offset associated with a reference voltage for identifying signals received on the channel. In some cases, the duration which the channel is in the second state may be at least equal to the duration of the offset calibration. The operations of 615 may be performed according to the methods described with reference to FIGS. 1-5.

In some examples, an apparatus as described herein may perform a method or methods, such as the method 600. The apparatus may include features, means, or instructions (e.g., a non-transitory computer-readable medium storing instructions executable by a processor) for identifying a first state of a channel for communicating data with a controller, the first state corresponding to an active termination of the channel, determining that the channel transitioned from the first state to a second state corresponding to interrupting the active termination, and calibrating, for a receiver coupled with the channel and while the channel is in the second state, an offset associated with a reference voltage for identifying signals received on the channel.

Some examples of the method 600, apparatuses, and non-transitory computer-readable medium described herein may further include operations, features, means, or instructions for determining that the channel transitioned from the first state to the second state during a first time period after exiting a reset state, calibrating, based on determining that the channel transitioned from the first state to the second state, the offset during a second time period after the channel transitioned from the first state to the second state, determining, after the second time period may have elapsed, that the channel transitioned out of the second state and performing an access operation based on determining that the channel transitioned from the second state.

In some examples of the method 600, apparatuses, and non-transitory computer-readable medium described herein, the first time period includes a first quantity of clock cycles and the second time period includes a second quantity of clock cycles. Some examples of the method 600, apparatuses, and non-transitory computer-readable medium described herein may further include operations, features, means, or instructions for receiving a signal indicating that the channel transitioned from the first state to the second state, where the calibration may be performed based on the signal.

Some examples of the method 600, apparatuses, and non-transitory computer-readable medium described herein may further include operations, features, means, or instructions for determining, after a first quantity of clock cycles may have elapsed, that the channel transitioned out of the second state and performing an access operation with the controller over the channel based on determining that the channel transitioned from the second state.

Some examples of the method 600, apparatuses, and non-transitory computer-readable medium described herein may further include operations, features, means, or instructions for receiving, from the controller, a second signal indicating that the channel transitioned out of the second state In some examples of the method 600, apparatuses, and non-transitory computer-readable medium described herein, the signal may be received over a second channel that may be different than the channel.

In some examples of the method 600, apparatuses, and non-transitory computer-readable medium described herein, the channel transitions from the first state to the second state before an access operation having a data transfer rate that satisfies a threshold In some examples of the method 600, apparatuses, and non-transitory computer-readable medium described herein, the second state corresponds to a bus having an impedance that satisfies a threshold.

Figure 7:
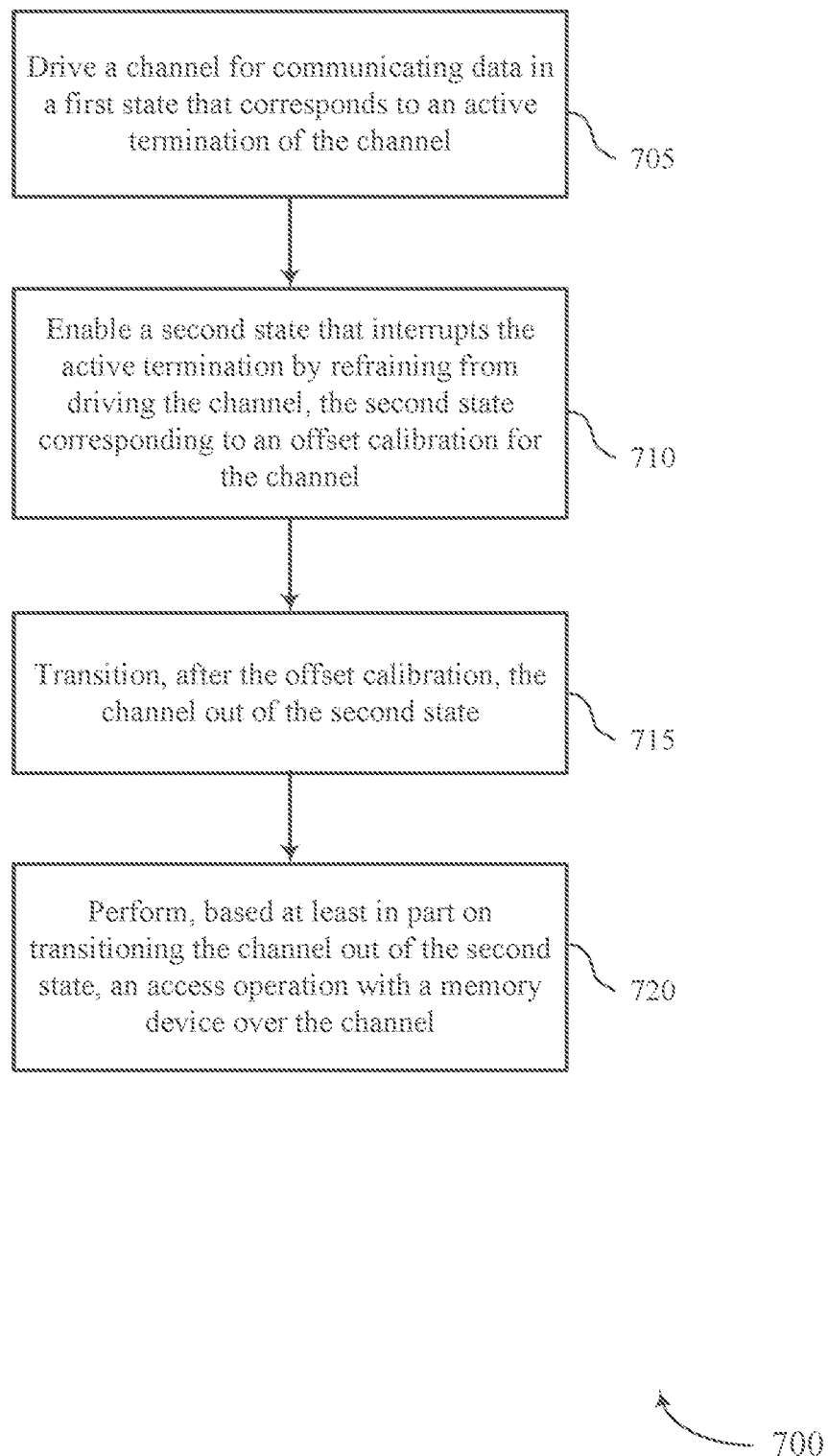

FIG. 7 shows a flowchart illustrating a method 700 that supports offset cancellation in accordance with aspects disclosed herein. The operations of method 700 may be implemented by a controller or its components as described with reference to FIGS. 1-5. For example, the operations of method 700 may be performed by a controller 405 as described with reference to FIG. 4 or a controller 505 as described with reference to FIG. 5. In some examples, the controller may execute a set of codes to control the functional elements of a device (e.g., a memory device 410, which may comprise a memory device 110) to perform the functions described herein.

At 705 the controller may drive a channel for communicating data in a first state that corresponds to an active termination of the channel. For instance, the channel may be actively driven such that a voltage used by a set of terminating resistors is maintained at a constant value (e.g., either low (0) or high (1)). The operations of 705 may be performed according to the methods described with reference to FIGS. 1-5.

At 710 the controller may enable a second state that interrupts the active termination by refraining from driving the channel, where the second state may correspond to an offset calibration for the channel. For instance, the second state may be a tri-state of the channel (e.g., in accordance with a tri-state logic) such that the channel is no longer actively driven by the controller. A memory device may accordingly take control of the channel when the channel is tri-stated, for example, to transmit calibration signals on the channel that is no longer being driven by the controller. The operations of 710 may be performed according to the methods described with reference to FIGS. 1-5.

At 715 the controller may transition, after the offset calibration, the channel out of the second state. In such cases, a defined duration for the offset calibration to be performed may occur, and the controller may transition the channel out of the tri-state following the defined duration. In some cases, the channel may return to the first state (e.g., an active termination state) subsequent to the offset calibration. The operations of 715 may be performed according to the methods described with reference to FIGS. 1-5.

At 720 the controller may perform, based on transitioning the channel out of the second state, an access operation with a memory device over the channel. For example, write data may be transmitted from the controller to the memory device over the channel. In such cases, the memory device may operate its receiver(s) using a reference voltage that has been calibrated based on the offset calibration performed while the channel was tri-stated. The operations of 720 may be performed according to the methods described with reference to FIGS. 1-5.

In some examples, an apparatus as described herein may perform a method or methods, such as the method 700. The apparatus may include features, means, or instructions (e.g., a non-transitory computer-readable medium storing instructions executable by a processor) for driving a channel for communicating data in a first state that corresponds to an active termination of the channel, enabling a second state that interrupts the active termination by refraining from driving the channel, the second state corresponding to an offset calibration for the channel, transitioning, after the offset calibration, the channel out of the second state, and performing, based on transitioning the channel out of the second state, an access operation with a memory device over the channel.

Some examples of the method 700, apparatuses, and non-transitory computer-readable medium described herein may further include operations, features, means, or instructions for identifying a first time period after exiting a reset state and a second time period after exiting the reset state and enabling the second state by refraining from driving the channel between the first time period and the second time period.

In some examples of the method 700, apparatuses, and non-transitory computer-readable medium described herein, the first time period includes a first quantity of clock cycles and the second time period includes a second quantity of clock cycles. Some examples of the method 700, apparatuses, and non-transitory computer-readable medium described herein may further include operations, features, means, or instructions for transmitting, to a receiver coupled with the channel, a first signal indicating that the channel transitioned from the first state to the second state.

Some examples of the method 700, apparatuses, and non-transitory computer-readable medium described herein may further include operations, features, means, or instructions for enabling the second state for a time period after transmitting the first signal, the time period corresponding to a duration of the offset calibration and transitioning the channel out of the second state after an expiration of the time period.

Some examples of the method 700, apparatuses, and non-transitory computer-readable medium described herein may further include operations, features, means, or instructions for transmitting, to the receiver, a second signal indicating that the channel transitioned out of the second state.

Some examples of the method 700, apparatuses, and non-transitory computer-readable medium described herein may further include operations, features, means, or instructions for identifying a command to execute the access operation over the channel and transmitting the first signal before the access operation, where the offset calibration may be performed before the beginning of the access operation.

Some examples of the method 700, apparatuses, and non-transitory computer-readable medium described herein may further include operations, features, means, or instructions for enabling the second state of the channel by deactivating an output driver coupled with the channel.

It should be noted that the methods described herein describe possible implementations, and that the operations and the steps may be rearranged or otherwise modified and that other implementations are possible. Further, aspects from two or more of the methods may be combined.

In some examples, an apparatus or device may perform aspects of the functions described herein using general- or special-purpose hardware. The apparatus or device may include a receiver coupled with a channel for communicating data that is configured to operate in a first state that corresponds to an active termination of the channel and a second state that interrupts the active termination, a processor configured to determine that the channel transitioned from the first state to the second state, and an output driver configured to drive a set of calibration signals on the channel while the channel is in the second state, where the receiver is configured to detect, based on the set of calibration signals, an offset associated with a reference voltage.

In some examples, the processor may be configured to identify a time period after the apparatus exits a reset state, and w here the processor may be configured to determine that the channel transitioned from the first state to the second state during the time period.

In some examples, the apparatus or device may include a counter configured to a count a set of clock cycles after the apparatus exits a reset state, where the processor may be configured to determine that the channel transitioned from the first state to the second state based on a first quantity of clock cycles counted by the counter, and where the output driver may be configured to drive the set of calibration signals until a second quantity of clock cycles may be counted by the counter.

In some examples, the receiver is configured to receive, from a controller, a signal indicating that the channel transitioned from the first state to the second state. In some cases, the receiver is configured to receive a second signal indicating that the channel transitioned from the second state to a third state that corresponds to performing an access operation over the channel. In some examples, the receiver is configured to detect the offset before performance of an access operation having a data transfer rate that satisfies a threshold. In some cases, the processor is configured to determine that the channel transitioned from the second state to a third state that corresponds to communicating over the channel after a time period.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any, conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are signals), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration." and not "preferred" or "advantageous over other examples." The detailed description includes specific details to providing an understanding of the described techniques. These techniques, how ever, may be practiced without these specific details In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM. ROM, electronically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining that an active termination of a channel for communicating data with a controller is interrupted;
   communicating a calibration signal on the channel based at least in part on determining that the active termination is interrupted;
   detecting, at a receiver coupled with the channel and based at least in part on the calibration signal, an offset associated with a reference voltage for identifying signals received on the channel; and
   calibrating the receiver to compensate for the offset based at least in part on the detecting.

2. The method of claim 1, further comprising:
   driving the reference voltage on the channel, wherein communicating the calibration signal is based at least in part on driving the reference voltage on the channel.

3. The method of claim 2, wherein the reference voltage driven on the channel is unmodified by the controller based at least in part on a termination of the controller at the channel.

4. The method of claim 1, further comprising:
   identifying a voltage level that corresponds to a transition from a first logic state to a second logic state; and
   comparing the identified voltage level to the reference voltage, wherein detecting the offset is based at least in part on comparing the voltage level to the reference voltage.

5. The method of claim 4, further comprising:
   driving a set of voltages on the channel, the set of voltages comprising the reference voltage and a first voltage at the identified voltage level, wherein identifying the voltage level is based at least in part on driving the set of voltages on the channel.

6. The method of claim 1, further comprising:
   modifying a voltage level at which the signals are received on the channel, wherein calibrating the receiver is based at least in part on modifying the voltage level at which the signals are received on the channel.

7. The method of claim 6, further comprising:
   activating a transistor included in the receiver and associated with comparing the reference voltage with the signals received on the channel at the receiver, wherein modifying the voltage level is based at least in part on activating the transistor.

8. The method of claim 1, further comprising:
   receiving, from the controller, a signal indicating that the active termination of the channel is interrupted, wherein determining that the active termination of the channel is interrupted is based at least in part on receiving the signal.

9. The method of claim 8, wherein the signal is received based at least in part on a transition from a first mode for communicating the data with the controller to a second mode for communicating the data with the controller, the first mode corresponding to a low-speed mode, the second mode corresponding to a high-speed mode.

10. The method of claim 1, further comprising:
    determining that a quantity of clock cycles has elapsed after completion of a power-up sequence, wherein determining that the active termination of the channel is interrupted is based at least in part on determining that the quantity of clock cycles has elapsed.

11. The method of claim 1, wherein the active termination of the channel is interrupted and the calibration signal is communicated on the channel during a power-up sequence.

12. The method of claim 1, further comprising:
    determining that the active termination of the channel has been interrupted for a threshold quantity of clock cycles, wherein the calibration signal is communicated within the threshold quantity of clock cycles; and
    determining that the active termination of the channel has resumed based at least in part on the active termination of the channel being interrupted for the threshold quantity of clock cycles.

13. The method of claim 1, further comprising:
    performing an access operation with the controller over the channel based at least in part on calibrating the receiver to compensate for the offset.

14. A method, comprising:
    interrupting an active termination of a channel for communicating data with a memory device, wherein the interruption of the active termination enables an offset calibration for data transmitted to the memory device over the channel; and
    driving, after the offset calibration, the channel to resume the active termination of the channel or to perform an access operation with the memory device over the channel.

15. The method of claim 14, further comprising:
    transmitting, to the memory device, a signal indicating that the active termination of the channel is interrupted.

16. The method of claim 15, wherein transmitting the signal is based at least in part on a transition from a first mode for communicating the data with the memory device to a second mode for communicating the data with the memory device, the first mode corresponding to a low-speed mode, the second mode corresponding to a high-speed mode.

17. The method of claim 14, further comprising:
    determining that a quantity of clock cycles has elapsed after completion of a power-up sequence, wherein interrupting the active termination of the channel is based at least in part on determining that the quantity of clock cycles has elapsed.

18. The method of claim 14, wherein the active termination of the channel is interrupted and the offset calibration is performed during a power-up sequence of the memory device.

19. The method of claim 14, further comprising:
deactivating an output driver coupled with the channel, wherein interrupting the active termination of the channel is based at least in part on deactivating the output driver.

20. An apparatus, comprising:
a receiver coupled with a channel for communicating data with an external controller; and
a controller operable to cause the apparatus to:
  determine that an active termination of the channel is interrupted;
  communicate a calibration signal on the channel based at least in part on determining that the active termination is interrupted;
  detect, at the receiver and based at least in part on the calibration signal, an offset associated with a reference voltage for identifying signals received on the channel; and
  calibrate the receiver to compensate for the offset based at least in part on the detecting.

* * * * *